United States Patent
Matsubara et al.

(10) Patent No.: US 9,203,447 B2
(45) Date of Patent: Dec. 1, 2015

(54) DISTORTION COMPENSATING DEVICE AND DISTORTION COMPENSATING METHOD

(71) Applicant: FUJITSU LIMITED, Kawasaki-shi, Kanagawa (JP)

(72) Inventors: Satoshi Matsubara, Kanagawa (JP); Hideharu Shako, Yokohama (JP); Mitsuharu Hamano, Sendai (JP)

(73) Assignee: FUJITSU LIMITED, Kawasaki (JP)

( * ) Notice: Subject to any disclaimer, the term of this patent is extended or adjusted under 35 U.S.C. 154(b) by 132 days.

(21) Appl. No.: 13/895,014

(22) Filed: May 15, 2013

(65) Prior Publication Data

US 2014/0003554 A1 Jan. 2, 2014

(30) Foreign Application Priority Data

Jul. 2, 2012 (JP) ................... 2012-148924

(51) Int. Cl.
 *H04L 25/49* (2006.01)
 *H04B 15/00* (2006.01)
 *H04B 1/04* (2006.01)

(52) U.S. Cl.
 CPC .................... *H04B 1/0475* (2013.01)

(58) Field of Classification Search
 USPC ............... 375/219, 220, 222, 240.26, 240.27, 375/285, 284, 295, 296, 297, 312, 316, 344, 375/345, 346, 347, 348, 370
 See application file for complete search history.

(56) References Cited

U.S. PATENT DOCUMENTS

| 7,514,996 | B2 | 4/2009 | Furuta et al. | |
| 8,520,772 | B2 * | 8/2013 | Suzuki et al. | 375/297 |
| 8,798,197 | B2 * | 8/2014 | Matsubara et al. | 375/297 |
| 2006/0198464 | A1 * | 9/2006 | Sasaki et al. | 375/296 |
| 2007/0200625 | A1 * | 8/2007 | Shako et al. | 330/149 |
| 2011/0221524 | A1 * | 9/2011 | Matsubara et al. | 330/149 |
| 2011/0227644 | A1 | 9/2011 | Matsubara et al. | |
| 2011/0255636 | A1 * | 10/2011 | Ashita et al. | 375/297 |

FOREIGN PATENT DOCUMENTS

| JP | 2001-284976 | 10/2001 |
| JP | 2011-199428 | 10/2011 |
| WO | WO-2006033256 | 3/2006 |

OTHER PUBLICATIONS

CNOA—Office Action of China Patent Application No. 201310205761.6 mailed on Sep. 22, 2015, with English translation.

* cited by examiner

*Primary Examiner* — Linda Wong
(74) *Attorney, Agent, or Firm* — Fujitsu Patent Center

(57) ABSTRACT

In a distortion compensating unit, a threshold calculating unit calculates a clip threshold to be set in an adjusting unit based on an address value generated by an address generating circuit. For example, the threshold calculating unit calculates the clip threshold by identifying the maximum value of address values generated by the address generating circuit in each adjustment unit period and subtracting a certain offset value from the identified maximum value. The adjusting unit adjusts a distortion compensation coefficient based on an address value received from the address generating circuit and a magnitude relationship with the set clip threshold.

9 Claims, 19 Drawing Sheets

DISTORTION COMPENSATING DEVICE AND DISTORTION COMPENSATING METHOD

CROSS-REFERENCE TO RELATED APPLICATION(S)

This application is based upon and claims the benefit of priority of the prior Japanese Patent Application No. 2012-148924, filed on Jul. 2, 2012, the entire contents of which are incorporated herein by reference.

FIELD

The embodiments discussed herein are related to a distortion compensating device and a distortion compensating method.

BACKGROUND

In recent years, with the development of digital communications, wireless communication devices, such as cellular phones and smartphones, perform data transmission with high efficiency. When a data-transmitting-side wireless communication device applies a multi-phase modulation method as a data transmitting method, it is important to linearize amplification characteristics of a transmission power amplifier to reduce non-linear distortion, thereby reducing power leaked to an adjacent channel.

Furthermore, to improve power efficiency with use of an amplifier having poor linearity, a technology to compensate non-linear distortion caused by the poor linearity is desirable. Therefore, a distortion compensating unit that compensates non-linear distortion of a power amplifier is provided in a wireless communication device.

The distortion compensating unit compares, for example, a transmission signal converted into I and Q signals by an S/P converter with a feedback signal that a portion of the amplified I and Q signals is fed back, and calculates a distortion compensation coefficient which reduces a difference between the transmission signal and the feedback signal to zero. Then, the distortion compensating unit multiplies the transmission signal converted into the I and Q signals by the distortion compensation coefficient, thereby compensating the distortion. The distortion compensating unit compares the transmission signal before the distortion compensation with a feedback signal that a portion of the signal amplified after the distortion compensation is fed back, and updates the distortion compensation coefficient so that a difference between these signals becomes zero as needed.

In general, non-linear characteristics of a power amplifier is produced in a saturation region. Namely, when power of a signal input to the power amplifier, i.e., the amplitude of a transmission signal is high, distortion is likely to be produced. Therefore, it is important to optimize a distortion compensation coefficient corresponding to high power. However, the appearance frequency of a high-power signal is low, so it takes time to optimize the distortion compensation coefficient. And, while the distortion compensation coefficient is being optimized, a spurious is produced in a band corresponding to an adjacent channel.

For example, as illustrated in FIG. 1, a table associating multiple addresses with distortion compensation coefficients corresponding to the addresses (hereinafter, sometimes also referred to as a "look-up table (LUT)") is provided. In FIG. 1, the horizontal axis indicates an address, and the vertical axis indicates a value of a distortion compensation coefficient. Here, an address corresponds to power of an input signal. As illustrated in FIG. 1, in the course of the optimization, a difference between an ideal distortion compensation coefficient and an actual distortion compensation coefficient is produced in a high address value. Due to this difference, a spurious is produced.

To solve this problem, conventionally, there has been proposed a technology to fix a distortion compensation coefficient corresponding to an address higher than a certain threshold (hereinafter, sometimes also referred to as "address clip"). In this conventional address clip, a distortion compensation coefficient corresponding to an address higher than the certain threshold (hereinafter, sometimes also referred to as the "clip threshold" or "address clip value") is set as a distortion compensation coefficient corresponding to the nearest address in addresses equal to or lower than the clip threshold (hereinafter, sometimes also referred to as a "clip coefficient").

Related-art examples are described, for example, in Japanese Laid-open Patent Publication No. 2011-199428 and Japanese Laid-open Patent Publication No. 2001-284976.

However, when the clip threshold is fixed to a too low value, the address clip is applied also to an address which is higher than the clip threshold and a distortion compensation coefficient corresponding thereto has been optimized. Furthermore, when the clip threshold is fixed to a too high value, a distortion compensation coefficient of an address which has not actually been optimized is used as a clip coefficient. As a result, a spurious is produced.

SUMMARY

According to an aspect of an embodiment, a distortion compensating device for compensating distortion of an amplifier includes: a multiplying unit that multiplies an input transmission signal by an input distortion compensation coefficient; a generating unit that generates an address value corresponding to power of the transmission signal; an adjusting unit that, when the generated address value is higher than a set threshold, retrieves a distortion compensation coefficient corresponding to the set threshold from a storage unit and inputs the retrieved distortion compensation coefficient to the multiplying unit, and, when the generated address value is equal to or lower than the set threshold, retrieves a distortion compensation coefficient corresponding to the generated address value from the storage unit and inputs the retrieved distortion compensation coefficient to the multiplying unit; and a threshold calculating unit that calculates a threshold on the basis of the generated address value and updates the set threshold with the calculated threshold.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Figure 1:
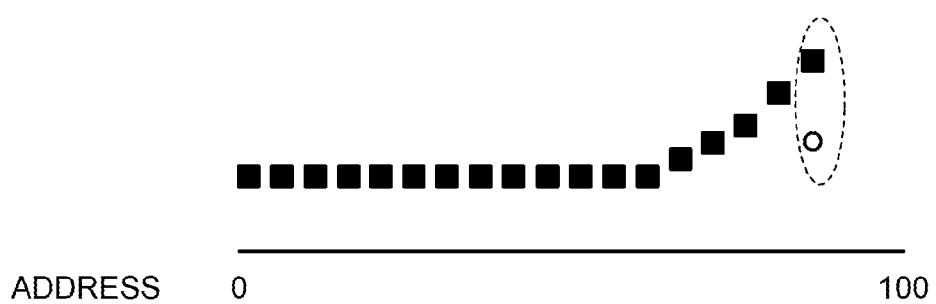
FIG. 1 is a diagram illustrating a difference between an ideal distortion compensation coefficient and an actual distortion compensation coefficient.

Preferred embodiments of the present invention will be explained with reference to accompanying drawings.

Incidentally, the distortion compensating device and distortion compensating method according to the present invention are not limited to the embodiments. Furthermore, in the embodiments, units having the same function are denoted by the same reference numeral to avoid repetition in description of the units.

[a] First Embodiment

Configuration of Wireless Communication Device

Figure 2:
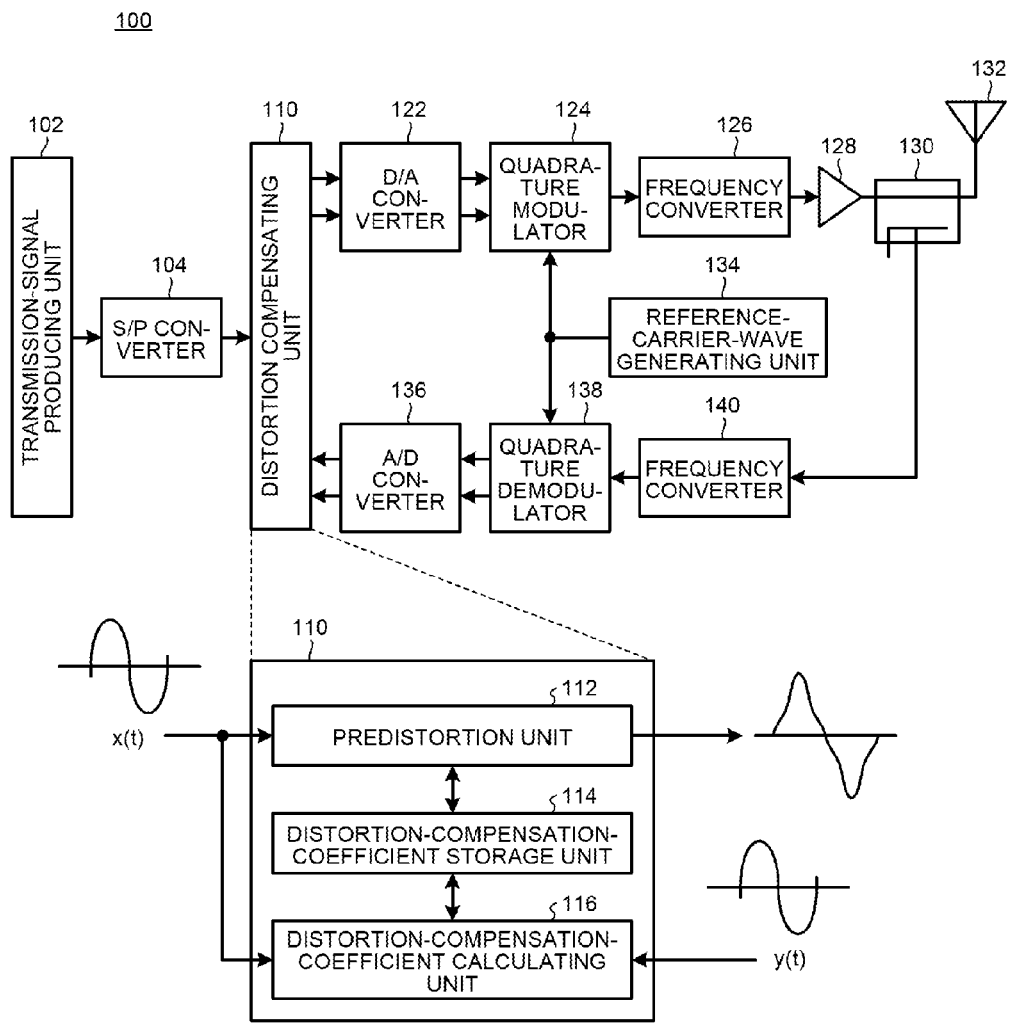
FIG. 2 is a diagram illustrating a configuration of a wireless communication device according to a first embodiment.

FIG. 2 is a diagram illustrating a configuration of a wireless communication device according to a first embodiment. In FIG. 2, a wireless communication device 100 includes a transmission-signal producing unit 102, a serial/parallel (S/P) converter 104, a distortion compensating unit 110, and a digital/analog (D/A) converter 122. The wireless communication device 100 further includes a quadrature modulator 124, a frequency converter 126, an amplifier 128, a directional coupler 130, an antenna 132, and a reference-carrier-wave generating unit 134. The wireless communication device 100 still further includes an A/D converter 136, a quadrature demodulator 138, and a frequency converter 140. The distortion compensating unit 110 includes a predistortion unit 112, a distortion-compensation-coefficient storage unit 114, and a distortion-compensation-coefficient calculating unit 116. The distortion compensating unit 110 is realized, for example, by a digital signal processor (DSP). The wireless communication device 100 is, for example, a base station.

The transmission-signal producing unit 102 produces a serial digital data string to be transmitted from the wireless communication device 100. The S/P converter 104 converts bits of the digital data string produced by the transmission-signal producing unit 102 into two series of in-phase component signals (I signals) and quadrature component signals (Q signals) alternately.

The D/A converter 122 converts each of the I and Q signals into an analog baseband signal. The quadrature modulator 124 performs quadrature transform by multiplying each of the I and Q signals (transmission baseband signals) output from the D/A converter 122 by a reference carrier wave generated by the reference-carrier-wave generating unit 134 and a carrier wave shifted in phase by 90 degrees from the reference carrier wave and adding up results of the multiplication.

The frequency converter 126 mixes a quadrature signal output from the quadrature modulator 124 and a local oscillator signal, thereby converting the quadrature signal into a radio frequency signal. The amplifier 128 amplifies the radio frequency signal output from the frequency converter 126 and radiates the amplified radio frequency signal into the air via the directional coupler 130 and the antenna 132.

The directional coupler 130 feeds back a portion of the transmitted signal and inputs a feedback signal to the frequency converter 140. The frequency converter 140 performs frequency conversion of the feedback signal. The quadrature demodulator 138 performs quadrature demodulation by multiplying the feedback signal output from the frequency converter 140 by the reference carrier wave generated by the reference-carrier-wave generating unit 134 and a signal shifted in phase by 90 degrees from the reference carrier wave to reproduce baseband I and Q signals on the transmitting side. The A/D converter 136 converts the feedback signal output from the quadrature demodulator 138 into a digital signal, and inputs the digital signal to the distortion compensating unit 110.

The distortion-compensation-coefficient storage unit 114 stores therein a distortion compensation coefficient h(pi) corresponding to power pi (i=0 to 1023) of a transmission signal x(t). The predistortion unit 112 performs a distortion compensating process (predistortion) on a transmission signal by using a distortion compensation coefficient h(pi) corresponding to a power level of the transmission signal. The distortion-compensation-coefficient calculating unit 116 compares a transmission signal x(t) with a demodulated signal (a feedback signal) y(t) demodulated by the quadrature demodulator 138, and calculates a distortion compensation coefficient h(pi) which reduces a difference between the transmission signal x(t) and the demodulated signal y(t) to zero, and then updates the distortion compensation coefficient stored in the distortion-compensation-coefficient storage unit 114.

In this way, the distortion compensating unit 110 adaptively updates a distortion compensation coefficient so that a difference between a feedback signal, which is a portion of a signal amplified by the amplifier 128, and a transmission signal before distortion compensation becomes zero.

Figure 3:
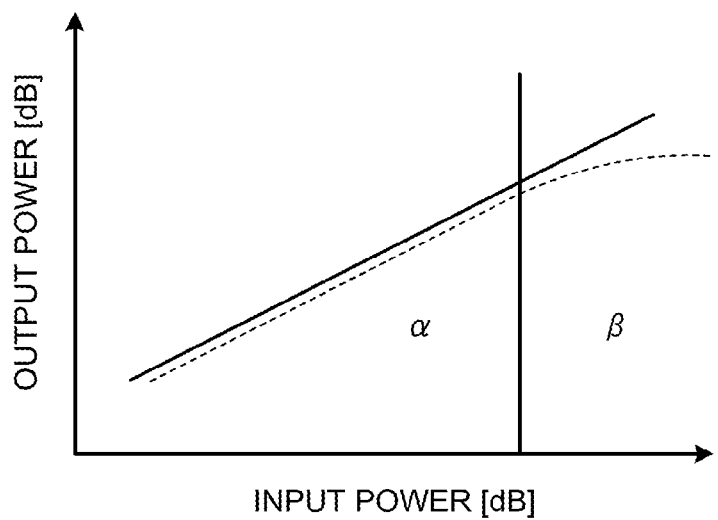
FIG. 3 is a diagram illustrating input-output characteristics of a transmission power amplifier.
Figure 4:
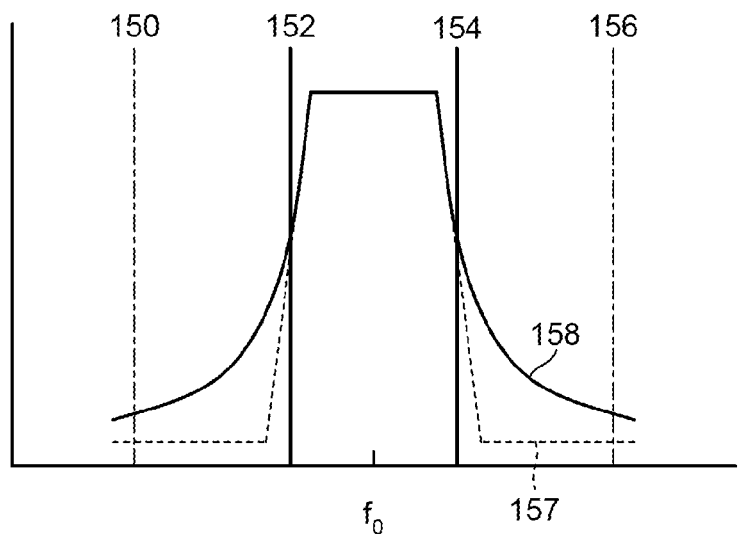
FIG. 4 is a diagram for explaining non-linear distortion caused by non-linear characteristics.

Subsequently, input-output characteristics of an amplifier and non-linear distortion caused by non-linear characteristics are explained. FIG. 3 is a diagram illustrating input-output characteristics of a transmission power amplifier. FIG. 4 is a diagram for explaining non-linear distortion caused by non-linear characteristics.

In mobile communication such as W-CDMA, transmission power of a wireless communication device is as high as 10 mW to several tens W, and input-output characteristics of the amplifier 128 (having a distortion function f(p)) is non-linear characteristics as indicated by a dashed line in FIG. 3. The non-linear characteristics causes non-linear distortion, and the side lobe of a frequency spectrum around a transmission frequency $f_0$ is raised from a characteristic indicated by a dashed line 157 to a characteristic indicated by a solid line 158 in FIG. 4. In this manner, a transmission signal is leaked to an adjacent channel, resulting in adjacent channel interference. Namely, due to the non-linear distortion illustrated in FIG. 3, power of a transmission signal leaked to an adjacent frequency channel is increased as illustrated in FIG. 4.

An adjacent channel power ratio (ACPR) indicating the magnitude of leakage power is a ratio of power of a target channel, i.e., a spectrum area between frequency bands 152 and 154 in FIG. 4 to adjacent channel power, i.e., a spectrum area leaked to adjacent channels between frequency bands 150 and 156. Such leakage power is noise for another channel and deteriorates the communication quality of the channel; therefore, leakage power is stringently regulated.

Leakage power is, for example, low in a linear region (a linear region $\alpha$ in FIG. 3) and high in a non-linear region $\beta$ of a power amplifier. Therefore, in a high-powered transmission power amplifier, it is desirable that a linear region $\alpha$ is extensive. However, to achieve this, it is desirable to provide an amplifier with higher performance than that is actually desirable, which causes disadvantages in the cost and device size. Accordingly, the distortion compensating unit 110 that compensates distortion of transmission power is included in the wireless communication device 100 as described above.

Configuration of Distortion Compensating Unit

Figure 5:
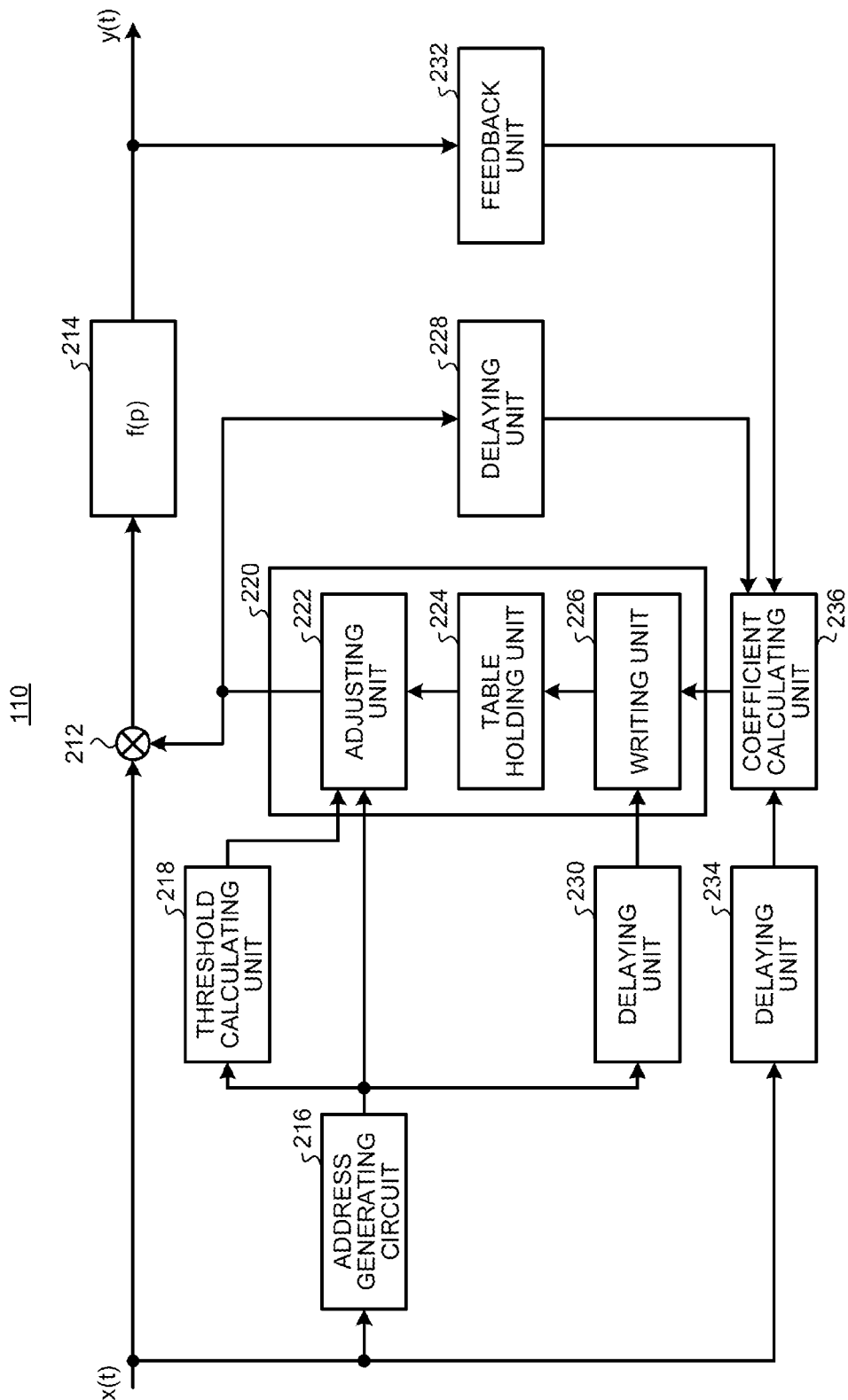
FIG. 5 is a diagram illustrating a configuration example of a distortion compensating unit according to the first embodiment.

FIG. 5 is a diagram illustrating a configuration example of the distortion compensating unit according to the first embodiment. In FIG. 5, the distortion compensating unit 110 includes a multiplying unit 212, a distortion-function calculating unit 214, an address generating circuit 216, a threshold calculating unit 218, a look-up table (LUT) 220, delaying units 228, 230, and 234, a feedback unit 232, and a coefficient calculating unit 236. The LUT 220 includes an adjusting unit 222, a table holding unit 224, and a writing unit 226.

The multiplying unit 212 in FIG. 5 corresponds to the predistortion unit 112 in FIG. 2. The multiplying unit 212 multiplies a transmission signal x(t) by a distortion compensation coefficient hn−1(p). The distortion-function calculating unit 214 in FIG. 5 corresponds to the amplifier 128 in FIG. 2.

The feedback unit 232 in FIG. 5 corresponds to a section including the directional coupler 130, the frequency converter 140, the quadrature demodulator 138, and the A/D converter 136 in FIG. 2. The LUT 220 in FIG. 5 corresponds to the distortion-compensation-coefficient storage unit 114 in FIG. 2. The coefficient calculating unit 236 in FIG. 5 corresponds to the distortion-compensation-coefficient calculating unit 116 in FIG. 2.

When a transmission signal x(t) has been input to the address generating circuit 216, the address generating circuit 216 calculates power p of the transmission signal x(t) and generates an address in a one-dimensional direction, such as a direction of the X axis, uniquely corresponding to the calculated power p of the transmission signal x(t). At the same time, the address generating circuit 216 finds a difference $\Delta P$ from power p1 of a transmission signal x(t−1) at a previous time (t−1) which has been stored in the address generating circuit 216, and generates an address in another dimensional direction, such as a direction of the Y axis, uniquely corresponding to the difference $\Delta P$. The generated address values are output to the threshold calculating unit 218, the adjusting unit 222, and the delaying unit 230.

At intervals of a unit period for threshold adjustment (hereinafter, sometimes also referred to as an "adjustment unit period"), the threshold calculating unit 218 identifies the maximum value of address values generated by the address generating circuit 216 and calculates a clip threshold on the basis of the identified maximum value. It is preferable that the adjustment unit period is within 1 to 100 milliseconds.

For example, the threshold calculating unit 218 calculates a clip threshold by subtracting a certain offset value from the identified maximum value. Namely, the clip threshold is an address value which is N, the certain offset value, lower than the maximum value. The offset value N is a positive value, and is, for example, any of natural numbers of 1 to 3. The calculated clip threshold is output to the adjusting unit 222. In this way, the clip threshold set in the adjusting unit 222 is updated at intervals of the adjustment unit period.

Incidentally, here, multiple address values are generated in an adjustment unit period. Namely, the "adjustment unit period" contains multiple sampling timings.

The adjusting unit 222 adjusts a distortion compensation coefficient on the basis of address values received from the address generating circuit 216 and a magnitude relationship with the set clip threshold.

For example, when an address value received from the address generating circuit 216 is equal to or lower than the clip threshold, the adjusting unit 222 retrieves a distortion compensation coefficient corresponding to the address value received from the address generating circuit 216 from an LUT held in the table holding unit 224 and outputs the retrieved distortion compensation coefficient to the multiplying unit 212. On the other hand, when an address value received from the address generating circuit 216 is higher than the clip threshold, the adjusting unit 222 retrieves a distortion compensation coefficient of an address corresponding to the clip threshold from the table holding unit 224 and outputs the retrieved distortion compensation coefficient to the multiplying unit 212.

Incidentally, the distortion compensation coefficient output from the adjusting unit 222 is also input as a coefficient parameter used in calculation of an LUT update value to the coefficient calculating unit 236 via the delaying unit 228.

The table holding unit 224 holds therein the LUT. Namely, the table holding unit 224 stores a distortion compensation coefficient for eliminating distortion of the distortion-function calculating unit 214 (an amplifier) in a two-dimensional address position corresponding to each discrete power of a transmission signal x(t).

The writing unit 226 sets an address generated by the address generating circuit 216 and a distortion compensation coefficient calculated by the coefficient calculating unit 236 as an input signal. Then, the writing unit 226 writes the distortion compensation coefficient calculated by the coefficient calculating unit 236 into the address generated by the address generating circuit 216, thereby updating the LUT. Incidentally, a read address (AR) and write address (AW) generated by the address generating circuit 216 are the same address; however, it takes time to obtain an update value because of a calculation time, etc., so the read address is delayed by the delaying unit 230 and is used as a write address.

The coefficient calculating unit 236 sets a transmission signal x(t), a feedback demodulated signal y(t) (a feedback signal), and a distortion compensation coefficient output from the adjusting unit 222 as an input signal. Here, the delaying units 228 and 234 are provided so that a signal input to the coefficient calculating unit 236 is obtained from the same transmission signal x(t). Namely, a delay time D set in the delaying units 228 and 234 is determined, for example, so as to satisfy D=D0+D1, where a delay time in the distortion-function calculating unit 214 (the amplifier) is denoted by D0, and a delay time of the feedback unit 232 is denoted by D1.

Figure 6:
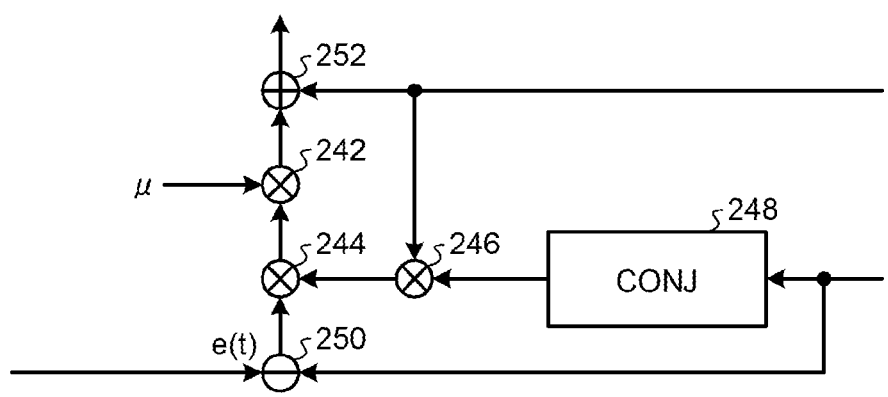
FIG. 6 is a diagram illustrating a configuration example of a coefficient calculating unit according to the first embodiment.

For example, as illustrated in FIG. 6, the coefficient calculating unit 236 includes multiplying units 242, 244, and 246, a complex-conjugate-signal output unit (Conj) 248, a subtracting unit 250, and an adding unit 252.

The subtracting unit 250 outputs a difference e(t) between a transmission signal x(t) delayed by the delaying unit 230 and a feedback demodulated signal y(t) (a feedback signal).

The multiplying unit 246 multiplies a distortion compensation coefficient hn−1(p) by y*(t) and obtains output u*(t)(=hn−1(p)y*(t)). The multiplying unit 244 multiplies the difference e(t) output from the subtracting unit 250 by u*(t). The multiplying unit 242 multiplies a step-size parameter μ by output of the multiplying unit 244.

Then, the adding unit 252 adds the distortion compensation coefficient hn−1(p) and μe(t)u*(t), which is output of the multiplying unit 242, and outputs a result of the addition to the writing unit 226.

The following calculations are performed by these mechanisms:

$$hn(p)=hn-1(p)+\mu e(t)u^*(t)$$

$$e(t)=x(t)-y(t)$$

$$y(t)=hn-1(p)x(t)f(p)$$

$$u^*(t)=x(t)f(p)=hn-1(p)y^*(t)$$

$$p=|x(t)|2$$

Provided, however, that x, y, f, h, u, and e are complex numbers, and * is a complex conjugate number. By performing the above calculations, a distortion compensation coefficient h(p) is updated so as to minimize a difference signal e(t) between a transmission signal x(t) and a feedback demodulated signal y(t), and eventually converges on the optimum distortion compensation coefficient value, and distortion of the amplifier 128 is compensated.

Operation of Distortion Compensating Unit

Figure 7:
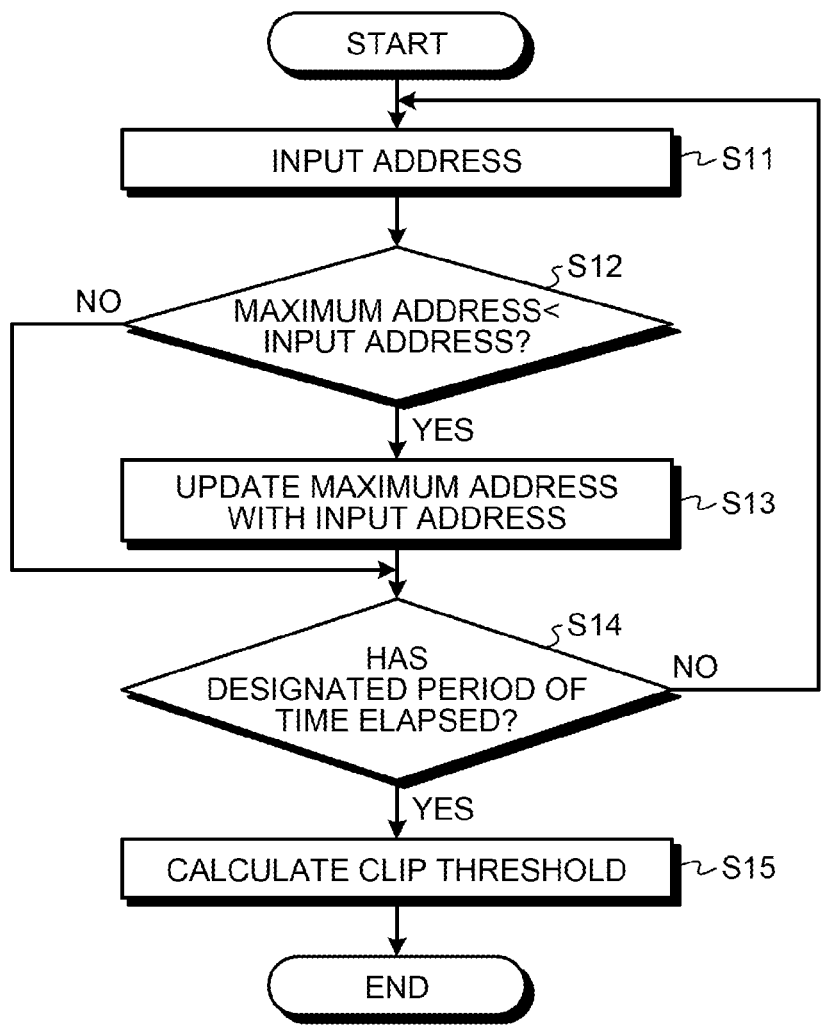
FIG. 7 is a flowchart illustrating an example of processing operation of the distortion compensating unit according to the first embodiment.
Figure 8:
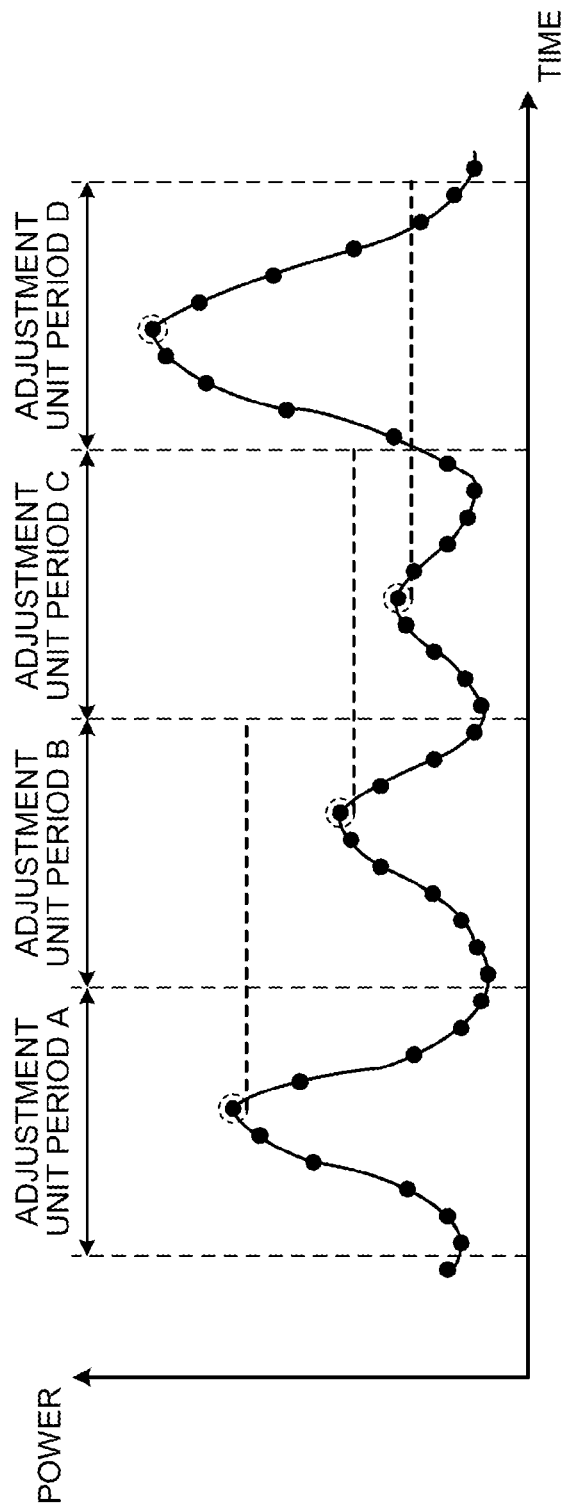
FIG. 8 is a diagram for explaining the processing operation of the distortion compensating unit according to the first embodiment in multiple adjustment unit periods.

The operation of the distortion compensating unit 110 having the above configuration is explained. FIG. 7 is a flowchart illustrating an example of processing operation of the distortion compensating unit 110 according to the first embodiment. FIG. 8 is a diagram for explaining the processing operation of the distortion compensating unit 110 according to the first embodiment in multiple adjustment unit periods.

When a given adjustment unit period has started, the flow illustrated in FIG. 7 is started.

The threshold calculating unit 218 receives input of an address value generated by the address generating circuit 216 (Step S11).

The threshold calculating unit 218 determines whether a just-input first address value is higher than a second address value which is the maximum value of previous address values input in the current adjustment unit period (Step S12).

When the first address value is higher than the second address value (YES at Step S12), the threshold calculating unit 218 updates the second address value with the first address value (Step S13). On the other hand, when the first address value is equal to or lower than the second address value (NO at Step S12), the threshold calculating unit 218 does not update the address value.

The threshold calculating unit 218 determines whether a designated period of time has elapsed since the start of the adjustment unit period, i.e., whether the adjustment unit period has ended (Step S14).

When the adjustment unit period has not ended (NO at Step S14), the process returns to Step S11. In this way, by repeating the processes at Steps S11 to S14, the maximum value of address values in the adjustment unit period is identified.

When the adjustment unit period has ended (YES at Step S14), the threshold calculating unit 218 calculates a clip threshold on the basis of the identified maximum value (Step S15).

Here, the adjustment unit period is repeated as illustrated in FIG. 8. A clip threshold calculated on the basis of the maximum value identified in an adjustment unit period A is set in the adjusting unit 222 in a period overlapped with the next adjustment unit period B after the adjustment unit period A.

Figure 9:
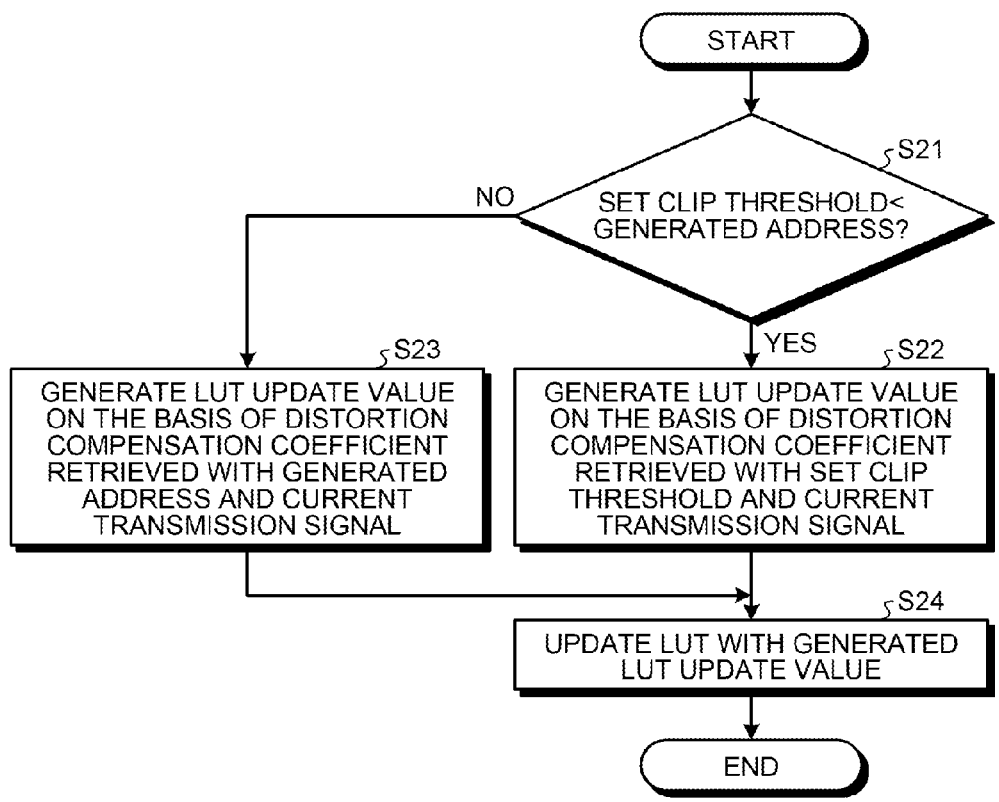
FIG. 9 is a diagram for explaining an LUT update process performed by the distortion compensating unit according to the first embodiment.

FIG. 9 is a diagram for explaining an LUT update process performed by the distortion compensating unit 110 according to the first embodiment.

When an address generated by the address generating circuit 216 is higher than a set clip threshold (YES at Step S21), the coefficient calculating unit 236 generates an LUT update value on the basis of a distortion compensation coefficient retrieved with the set clip threshold and a current transmission signal x(t) (Step S22).

On the other hand, when an address generated by the address generating circuit 216 is equal to or lower than a set clip threshold (NO at Step S21), the coefficient calculating unit 236 generates an LUT update value on the basis of a distortion compensation coefficient retrieved with the address generated by the address generating circuit 216 and a current transmission signal x(t) (Step S23).

The writing unit 226 writes a distortion compensation coefficient calculated by the coefficient calculating unit 236 into the address generated by the address generating circuit 216, thereby updating the LUT (Step S24).

As described above, according to the present embodiment, in the distortion compensating unit 110, the threshold calculating unit 218 calculates a clip threshold to be set in the adjusting unit 222 on the basis of an address value generated by the address generating circuit 216.

By doing this, the set clip threshold can be sequentially updated to an appropriate value on the basis of an address value generated by the address generating circuit 216, and therefore, the production of a spurious can be reduced.

For example, at intervals of the adjustment unit period, the threshold calculating unit 218 identifies the maximum value of address values generated by the address generating circuit 216 and calculates a clip threshold by subtracting a certain offset value N from the identified maximum value.

[b] Second Embodiment

In a second embodiment, when it has been determined that a clip threshold calculated on the basis of a just-generated address value is higher than a currently-set clip threshold, the just-calculated clip threshold is set as a new set clip threshold. Furthermore, a subtracting process for subtracting a certain value from the set clip threshold is performed in each "execution cycle". Incidentally, a basic configuration of a distortion compensating unit in the second embodiment is the same as the distortion compensating unit 110 in the first embodiment, so the present embodiment is explained by quoting FIG. 5.

The threshold calculating unit 218 of the distortion compensating unit 110 in the second embodiment calculates a clip threshold on the basis of an input address value each time the address value has been input from the address generating circuit 216. Then, the threshold calculating unit 218 compares the just-calculated clip threshold with a set clip threshold which has been currently set in the adjusting unit 222 and held in the threshold calculating unit 218. As a result of the comparison, when the just-calculated clip threshold is higher than the currently-set clip threshold, the threshold calculating unit 218 sets the just-calculated clip threshold as a new set clip threshold.

Furthermore, in each execution cycle, the threshold calculating unit 218 subtracts a certain value from the set clip threshold and newly sets the obtained clip threshold in the adjusting unit 222. It is preferable that the execution cycle is within 1 to 100 milliseconds.

Figure 10:
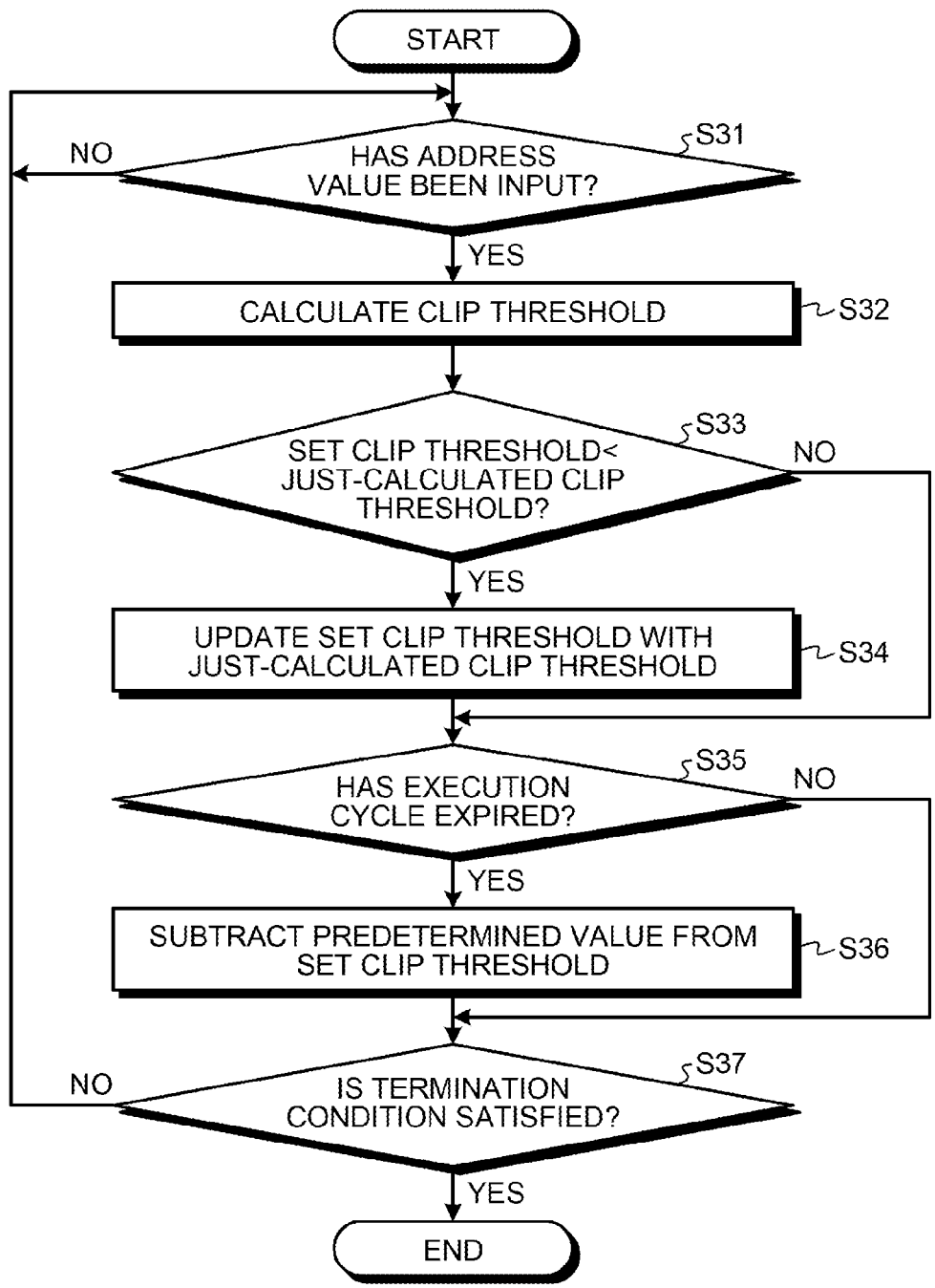
FIG. 10 is a flowchart illustrating an example of processing operation of a distortion compensating unit according to a second embodiment.
Figure 11:
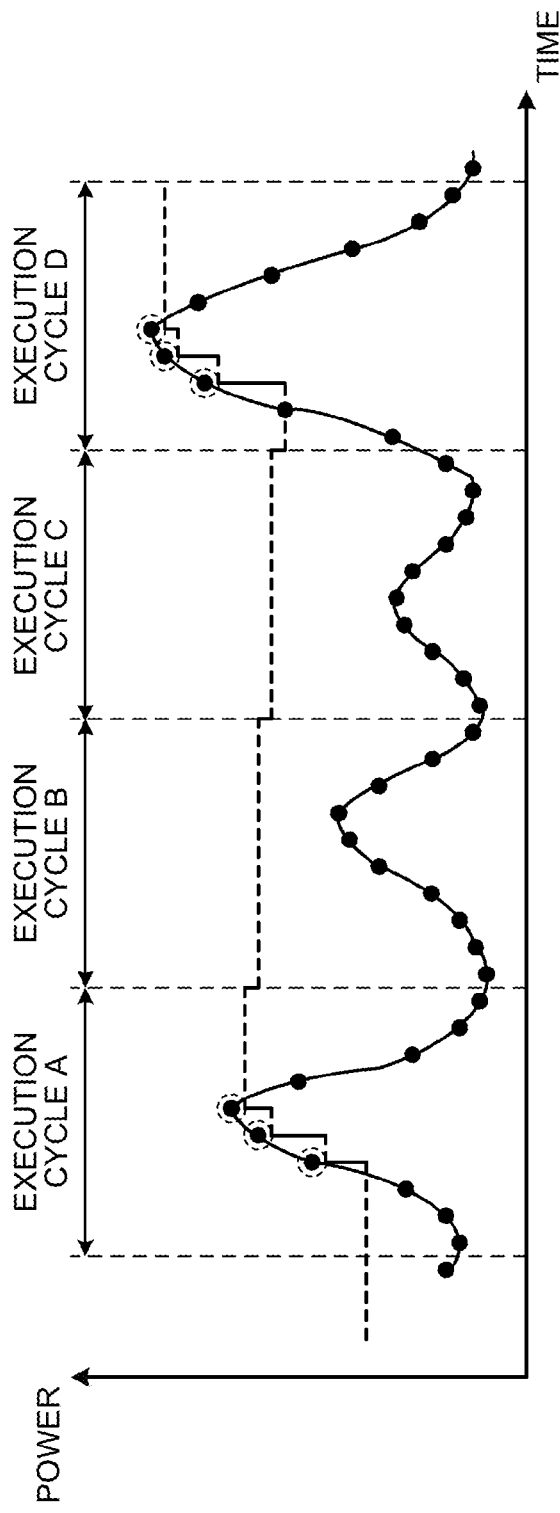
FIG. 11 is a diagram for explaining the processing operation of the distortion compensating unit according to the second embodiment.

FIG. 10 is a flowchart illustrating an example of processing operation of the distortion compensating unit 110 according to the second embodiment. FIG. 11 is a diagram for explaining the processing operation of the distortion compensating unit 110 according to the second embodiment.

When an address value has been input to the threshold calculating unit 218 (YES at Step S31), the threshold calculating unit 218 calculates a clip threshold on the basis of the input address value (Step S32).

The threshold calculating unit 218 compares the just-calculated clip threshold with a set clip threshold which has been currently set in the adjusting unit 222 and held in the threshold calculating unit 218 (Step S33).

When the just-calculated clip threshold is higher than the currently-set clip threshold (YES at Step S33), the threshold calculating unit 218 updates the set clip threshold with the just-calculated clip threshold (Step S34). Incidentally, when the just-calculated clip threshold is not higher than the currently-set clip threshold (NO at Step S33), the threshold calculating unit 218 does not update the set clip threshold.

The threshold calculating unit 218 determines whether an execution cycle of the subtracting process has expired (Step S35). When the execution cycle has expired (YES at Step S35), the threshold calculating unit 218 subtracts a certain value from the set clip threshold (Step S36). Incidentally, when the execution cycle has not expired (NO at Step S35), the threshold calculating unit 218 does not perform the subtracting process.

The threshold calculating unit 218 determines whether a termination condition is satisfied (Step S37). When the termination condition is not satisfied (NO at Step S37), the process returns to Step S31; when the termination condition is satisfied (YES at Step S37), the process illustrated in FIG. 10 is terminated. The termination condition is, for example, power-off of the wireless communication device 100 or the like.

Here, the execution cycle is repeated as illustrated in FIG. 11. In FIG. 11, in execution cycles A and D, the set clip threshold has been updated three times. On the other hand, in execution cycles B and C, the set clip threshold has never been updated. In this way, while the set clip threshold is not updated in some of the execution cycles, the subtracting process is definitely performed at the boundary between two adjacent execution cycles.

As described above, according to the present embodiment, in the distortion compensating unit 110, each time a clip threshold higher than the currently-set clip threshold is calculated on the basis of a just-generated address value, the threshold calculating unit 218 updates the set clip threshold with the just-calculated clip threshold.

By doing this, the conformance with a change in power of a transmission signal can be improved.

Furthermore, in each execution cycle, the threshold calculating unit 218 subtracts a certain value from the set clip threshold.

By doing this, even when the set clip threshold has been set to an excessive value, the set clip threshold can be adjusted to an appropriate value.

[c] Third Embodiment

In a third embodiment, in the same manner as in the second embodiment, when it has been determined that a clip threshold calculated on the basis of a just-generated address value is higher than a currently-set clip threshold, the just-calculated clip threshold is set as a new set clip threshold. Meanwhile, in the third embodiment, unlike in the second embodiment, the subtracting process is performed when the set clip threshold has not been newly updated in an "execution determining period". Incidentally, a basic configuration of a distortion compensating unit in the third embodiment is the same as the distortion compensating unit 110 in the first embodiment, so the present embodiment is explained by quoting FIG. 5.

The threshold calculating unit 218 of the distortion compensating unit 110 in the third embodiment calculates a clip threshold on the basis of an input address value each time the address value has been input from the address generating circuit 216. Then, the threshold calculating unit 218 compares the just-calculated clip threshold with a set clip threshold which has been currently set in the adjusting unit 222 and held in the threshold calculating unit 218. As a result of the comparison, when the just-calculated clip threshold is higher than the currently-set clip threshold, the threshold calculating unit 218 sets the just-calculated clip threshold as a new set clip threshold.

Furthermore, when the set clip threshold has not been newly updated in an "execution determining period", the threshold calculating unit 218 performs the subtracting process. The "execution determining period" is a certain period of time starting from arbitrary update timing of the set clip threshold.

Figure 12:
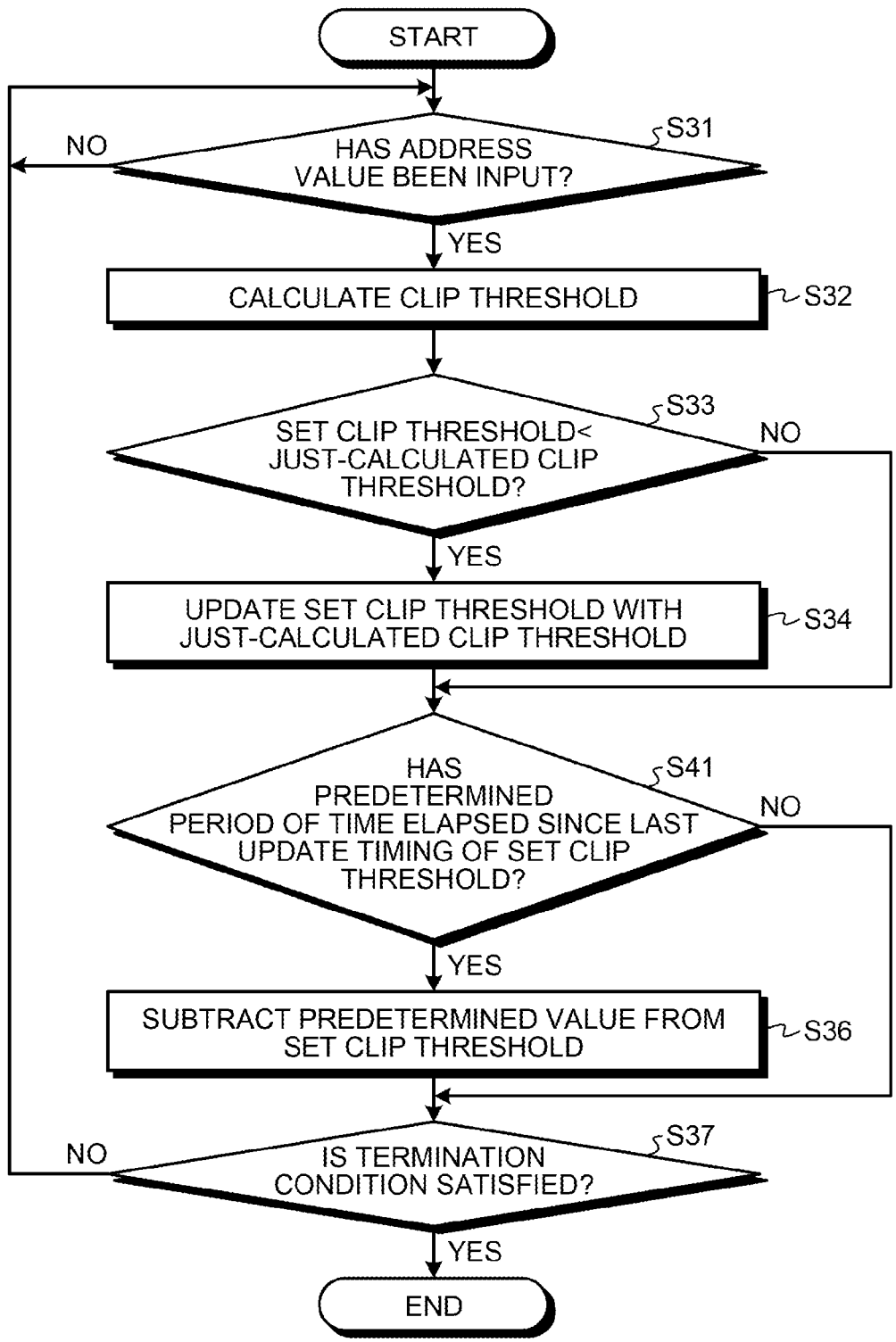
FIG. 12 is a flowchart illustrating an example of processing operation of a distortion compensating unit according to a third embodiment.
Figure 13:
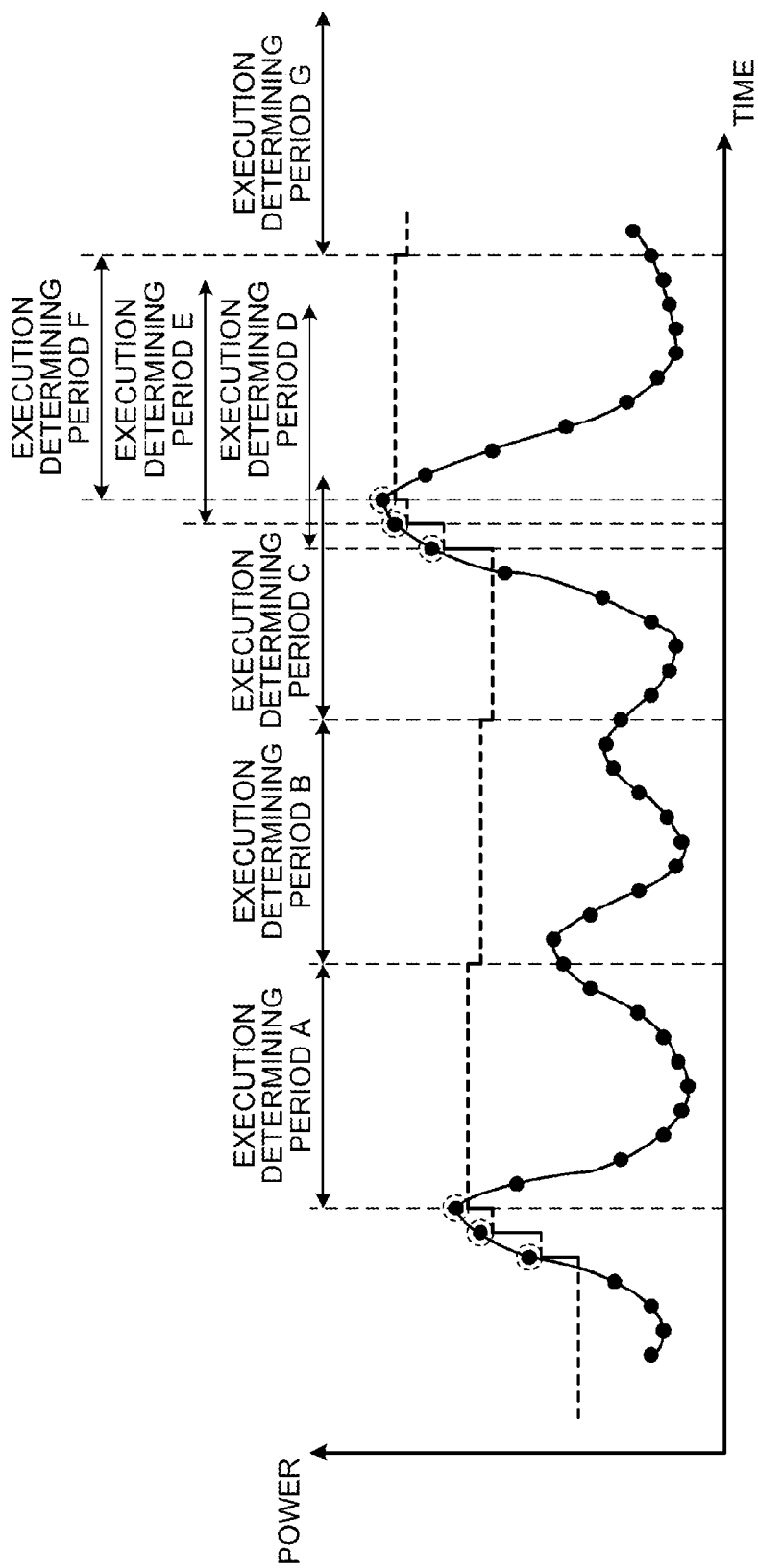
FIG. 13 is a diagram for explaining the processing operation of the distortion compensating unit according to the third embodiment.

FIG. 12 is a flowchart illustrating an example of processing operation of the distortion compensating unit 110 according to the third embodiment. FIG. 13 is a diagram for explaining the processing operation of the distortion compensating unit 110 according to the third embodiment.

The threshold calculating unit 218 determines whether the set clip threshold has been newly updated in an execution determining period, i.e., whether a certain period of time has elapsed since the last update timing of the set clip threshold (Step S41).

When having determined that the certain period of time has elapsed (YES at Step S41), the threshold calculating unit 218 subtracts a certain value from the set clip threshold (Step S36).

Here, as illustrated in FIG. 13, the execution determining period is renewed on each update of the set clip threshold. The set clip threshold has not been newly updated in execution determining periods A and F, so the subtracting process was performed at the end of the execution determining periods A and F. Incidentally, as can be seen from execution determining periods B and C, an execution determining period started from the timing at which the subtracting process was performed.

As described above, according to the present embodiment, when the set clip threshold has not been newly updated in an execution determining period, the threshold calculating unit 218 performs the subtracting process. The execution determining period is a certain period of time starting from arbitrary update timing of the set clip threshold.

By doing this, an excessive adjustment of the set clip threshold can be prevented, and, when the set clip threshold has not been newly updated in an execution determining period and is likely to have been set to an excessive value, the set clip threshold can be definitely adjusted to an appropriate value.

[d] Fourth Embodiment

In a fourth embodiment, when the following condition is satisfied, an LUT update value is generated on the basis of a distortion compensation coefficient retrieved with the set clip threshold and a current transmission signal x(t). The condition is that an address generated by the address generating circuit is higher than the set clip threshold, and a distortion compensation coefficient corresponding to the address generated by the address generating circuit is a table initial value.

Figure 14:
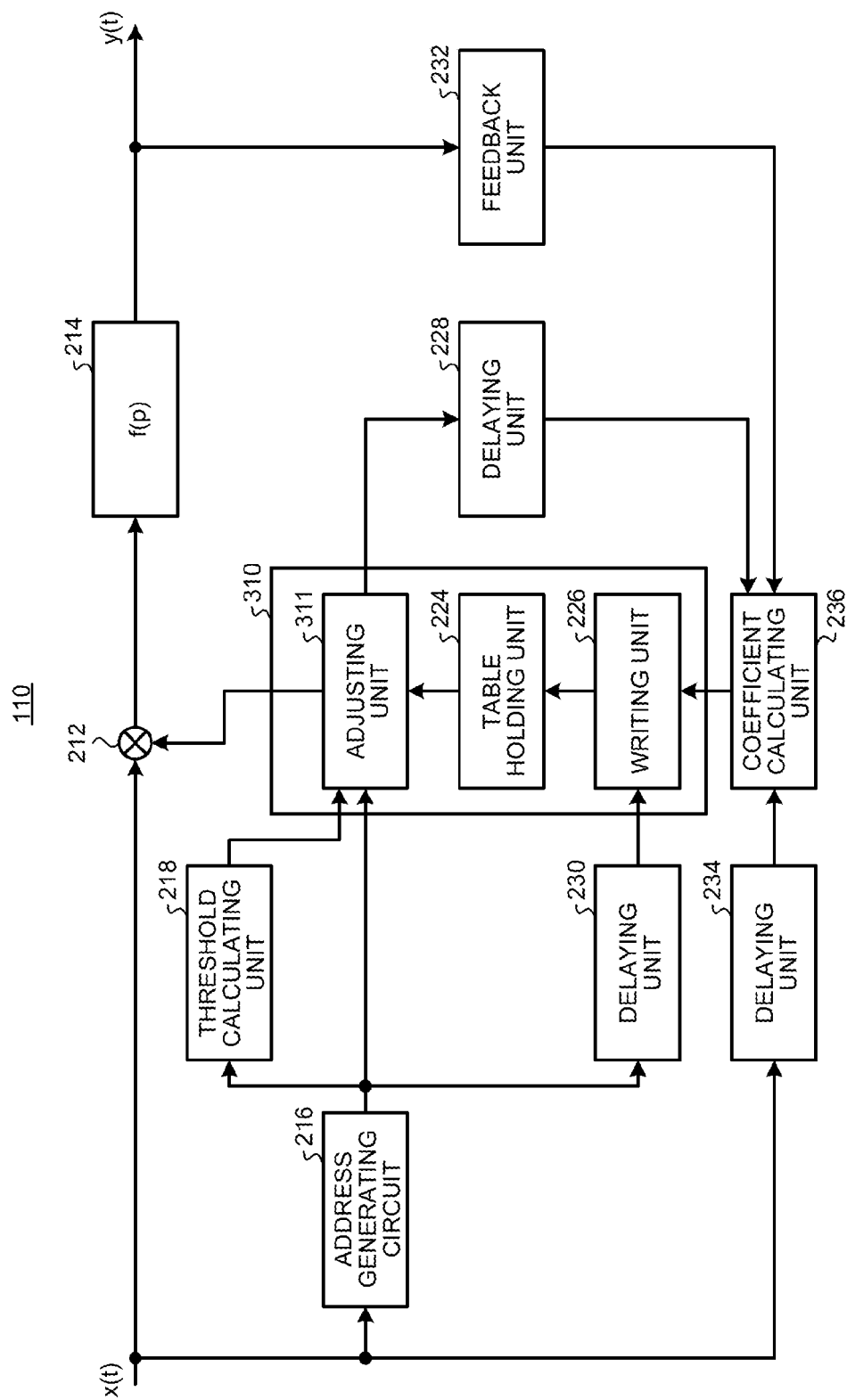
FIG. 14 is a diagram illustrating a configuration example of a distortion compensating unit according to a fourth embodiment.

FIG. 14 is a diagram illustrating a configuration example of a distortion compensating unit according to the fourth embodiment. In FIG. 14, the distortion compensating unit 110 includes an LUT 310. The LUT 310 includes an adjusting unit 311.

The adjusting unit 311 performs the same processing as the adjusting unit 222 according to any of the first to third embodiments, and outputs a distortion compensation coefficient to the multiplying unit 212.

Furthermore, only when a condition 1 is satisfied, the adjusting unit 311 outputs a distortion compensation coefficient retrieved with the set clip threshold as a coefficient parameter to the coefficient calculating unit 236. The condition 1 is that an address generated by the address generating circuit 216 is higher than the set clip threshold, and a distortion compensation coefficient corresponding to the address generated by the address generating circuit 216 is a table initial value.

On the other hand, when the condition 1 is not satisfied, the adjusting unit 311 outputs a distortion compensation coefficient retrieved with an address generated by the address generating circuit 216 as a coefficient parameter to the coefficient calculating unit 236.

Figure 15:
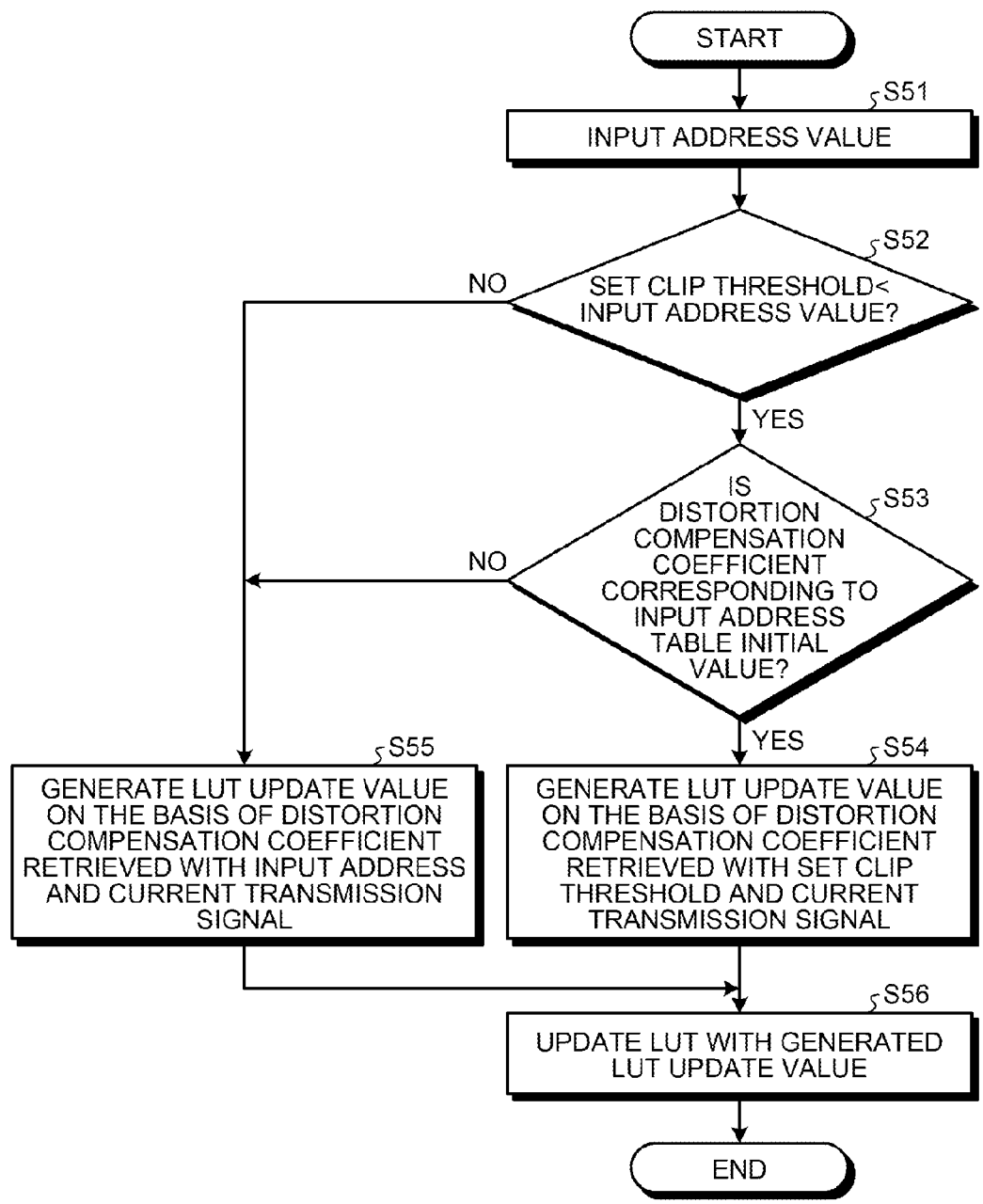
FIG. 15 is a flowchart illustrating an example of processing operation of the distortion compensating unit according to the fourth embodiment.

FIG. 15 is a flowchart illustrating an example of processing operation of the distortion compensating unit 110 according to the fourth embodiment.

The adjusting unit 311 receives input of an address value generated by the address generating circuit 216 (Step S51).

The adjusting unit 311 compares the input address value with the set clip threshold (Step S52).

When the input address value is higher than the set clip threshold (YES at Step S52), the adjusting unit 311 determines whether a distortion compensation coefficient associated with the input address value in the LUT is a table initial value (Step S53).

When the distortion compensation coefficient is a table initial value (YES at Step S53), the adjusting unit 311 outputs a distortion compensation coefficient retrieved with the set clip threshold to the coefficient calculating unit 236. The coefficient calculating unit 236 generates a distortion compensation coefficient, i.e., an LUT update value on the basis of the distortion compensation coefficient retrieved with the set clip threshold and a current transmission signal x(t) (Step S54).

On the other hand, when the input address value is equal to or lower than the set clip threshold (NO at Step S52) or when the distortion compensation coefficient is not a table initial value (NO at Step S53), the adjusting unit 311 outputs a distortion compensation coefficient retrieved with the input address value to the coefficient calculating unit 236. The coefficient calculating unit 236 generates a distortion compensation coefficient, i.e., an LUT update value on the basis of the distortion compensation coefficient retrieved with the input address value and a current transmission signal x(t) (Step S55).

The writing unit 226 writes the distortion compensation coefficient calculated by the coefficient calculating unit 236 into the address generated by the address generating circuit 216, thereby updating the LUT (Step S56).

As described above, according to the present embodiment, in the distortion compensating unit 110, the coefficient calculating unit 236 calculates an update value of the distortion compensation coefficient stored in the LUT on the basis of a transmission signal before amplification by the distortion-function calculating unit 214 (the amplifier), a transmission signal after the amplification, and a coefficient parameter. The coefficient parameter is a distortion compensation coefficient corresponding to the set clip threshold when an address generated by the address generating circuit 216 is higher than the set clip threshold, and a distortion compensation coefficient corresponding to the address generated by the address generating circuit 216 is a table initial value.

By doing this, an update value can be calculated by using a distortion compensation coefficient which corresponds to the set clip threshold and is closer to an ideal value than the initial value, and therefore, a time for an update value to approach the ideal value can be shortened.

[e] Fifth Embodiment

In a fifth embodiment, when an address generated by the address generating circuit is higher than the set clip threshold, an LUT update value is generated on the basis of a weighted average value and a current transmission signal x(t). The weighted average value is a weighted average of a distortion compensation coefficient retrieved with the set clip threshold and a distortion compensation coefficient retrieved with the address generated by the address generating circuit.

Figure 16:
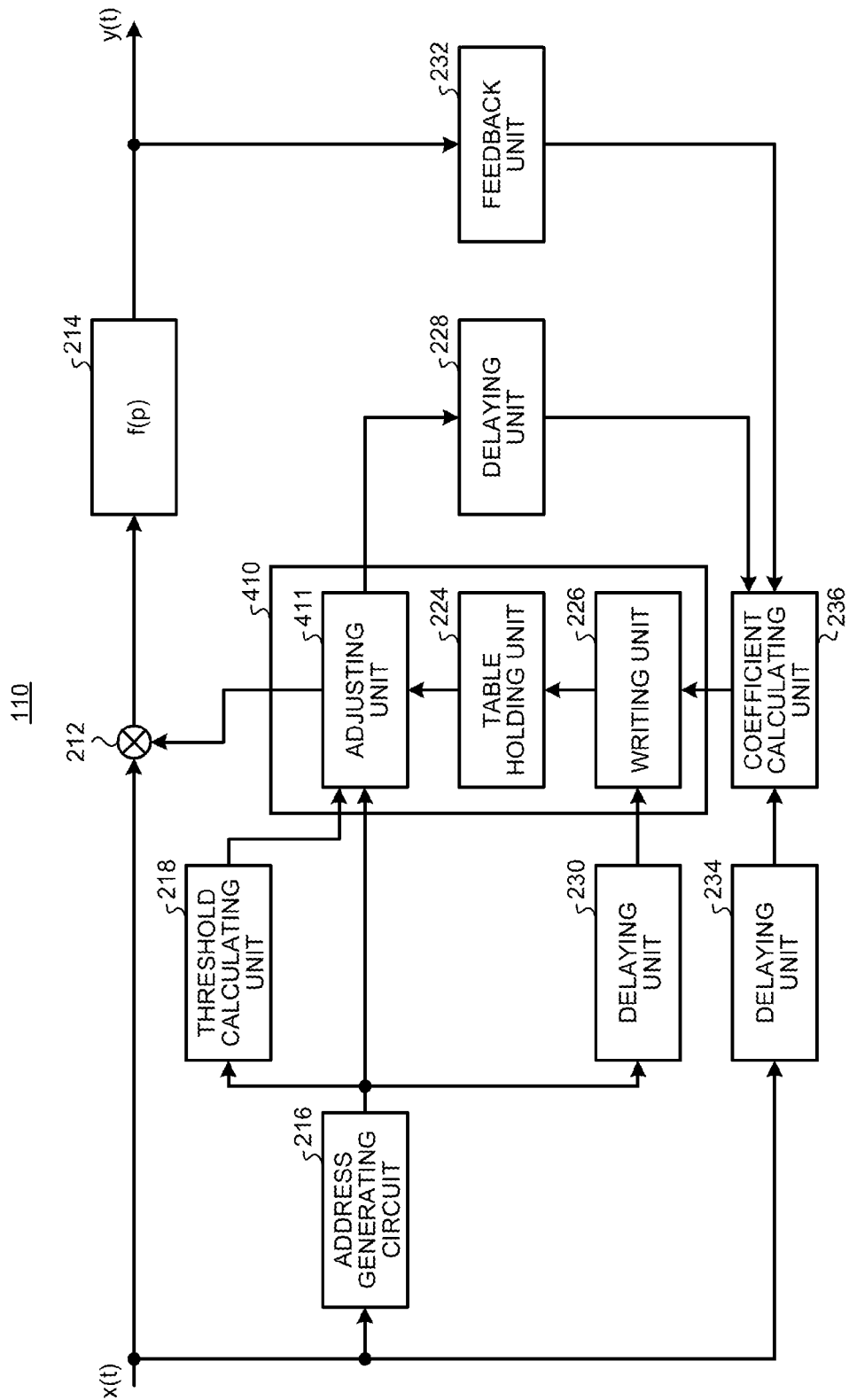
FIG. 16 is a diagram illustrating a configuration example of a distortion compensating unit according to a fifth embodiment.

FIG. 16 is a diagram illustrating a configuration example of a distortion compensating unit according to the fifth embodiment. In FIG. 16, the distortion compensating unit 110 includes an LUT 410. The LUT 410 includes an adjusting unit 411.

The adjusting unit 411 performs the same processing as the adjusting unit 222 according to any of the first to third embodiments, and outputs a distortion compensation coefficient to the multiplying unit 212.

Furthermore, when an address generated by the address generating circuit 216 is higher than the set clip threshold, the adjusting unit 411 calculates a weighted average of a distortion compensation coefficient retrieved with the set clip threshold and a distortion compensation coefficient retrieved with the address generated by the address generating circuit

216. Then, the adjusting unit 411 outputs the calculated weighted average as a coefficient parameter to the coefficient calculating unit 236.

On the other hand, when an address generated by the address generating circuit 216 is equal to or lower than the set clip threshold, the adjusting unit 411 outputs a distortion compensation coefficient retrieved with the address generated by the address generating circuit 216 as a coefficient parameter to the coefficient calculating unit 236.

Figure 17:
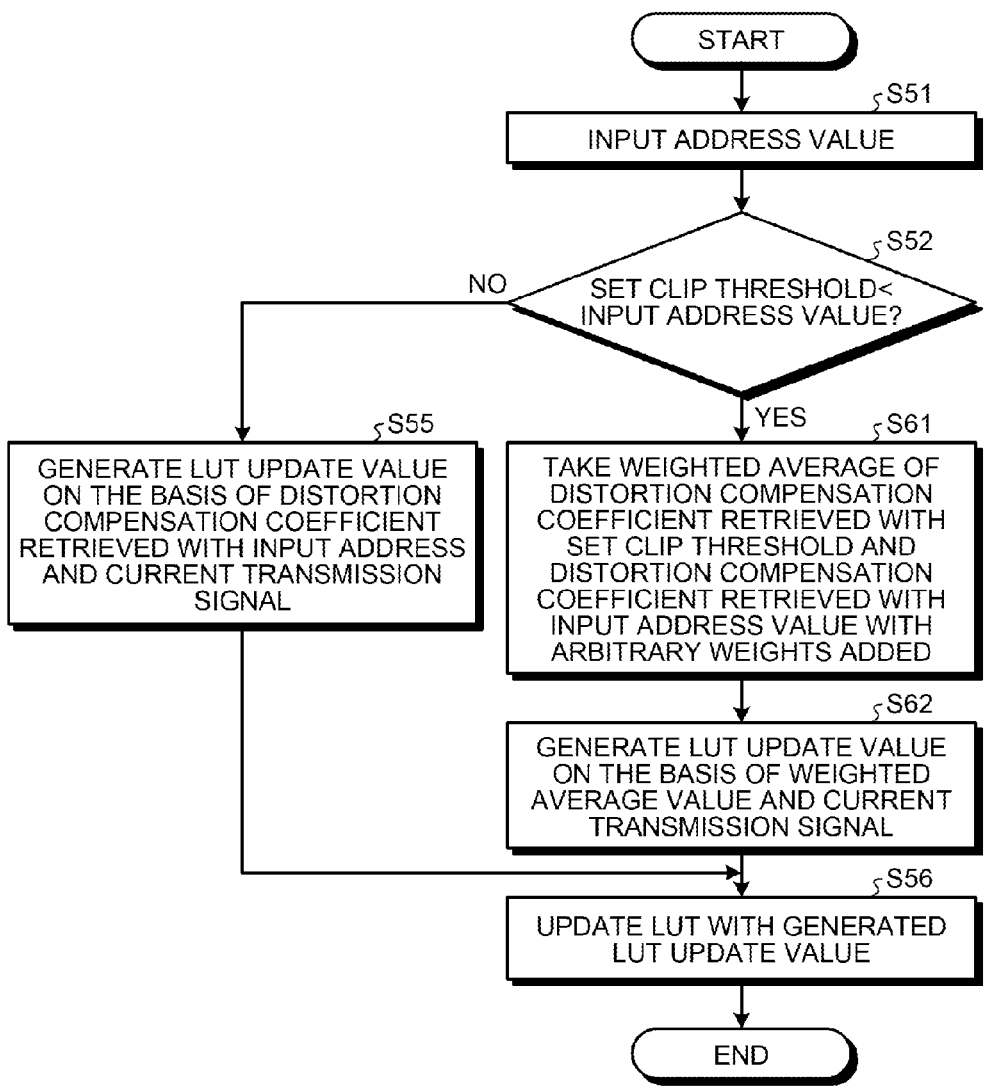
FIG. 17 is a flowchart illustrating an example of processing operation of the distortion compensating unit according to the fifth embodiment.

FIG. 17 is a flowchart illustrating an example of processing operation of the distortion compensating unit 110 according to the fifth embodiment.

The adjusting unit 411 performs the same process as described in FIG. 15 (Steps S51 and S52).

When the input address value is higher than the set clip threshold (YES at Step S52), the adjusting unit 411 calculates a weighted average value as described above (Step S61) and outputs the calculated weighted average value to the coefficient calculating unit 236. The coefficient calculating unit 236 generates a distortion compensation coefficient, i.e., an LUT update value on the basis of the weighted average value and a current transmission signal x(t) (Step S62). Incidentally, processes at Steps S55 and S56 are performed in the same way as described in FIG. 15.

As described above, according to the present embodiment, in the distortion compensating unit 110, the coefficient calculating unit 236 calculates an update value of the distortion compensation coefficient stored in the LUT on the basis of a transmission signal before amplification by the distortion-function calculating unit 214 (the amplifier), a transmission signal after the amplification, and a coefficient parameter. When an address generated by the address generating circuit 216 is higher than the set clip threshold, the coefficient parameter is a weighted average value of a distortion compensation coefficient retrieved with the set clip threshold and a distortion compensation coefficient retrieved with the address generated by the address generating circuit 216.

By doing this, an update value can be calculated by using a distortion compensation coefficient which corresponds to the set clip threshold and is further closer to an ideal value, and therefore, a time for an update value to approach the ideal value can be shortened. Furthermore, an update value can be calculated by using a distortion compensation coefficient retrieved with an address generated by the address generating circuit 216, and therefore, it is possible to calculate an update value that reflects the current situation.

[f] Sixth Embodiment

In a sixth embodiment, an LUT update value calculated on the basis of a distortion compensation coefficient corresponding to the set clip threshold or an address generated by the address generating circuit whichever makes an error smaller than the other and a current transmission signal x(t) is used in update of the LUT.

Figure 18:
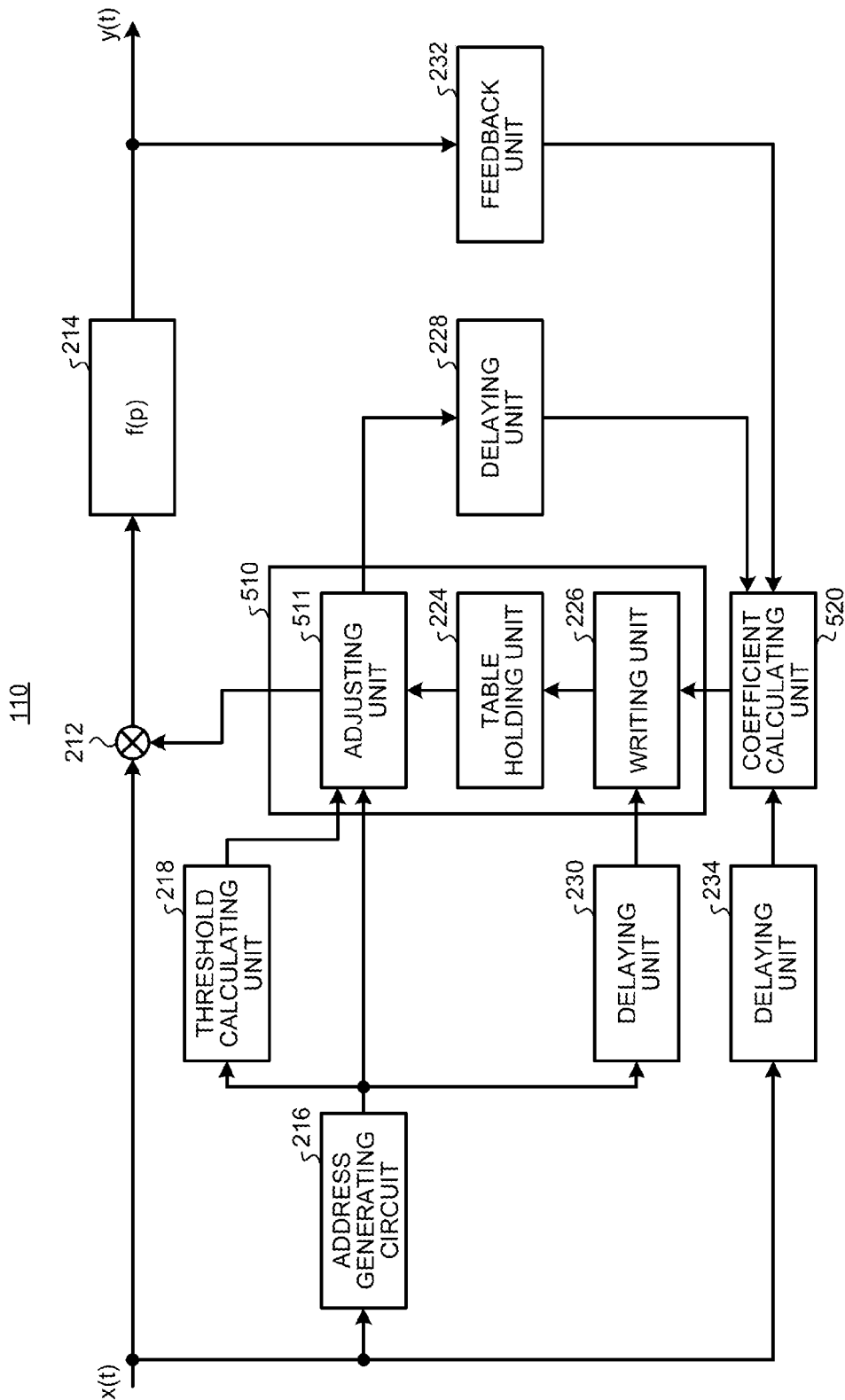
FIG. 18 is a diagram illustrating a configuration example of a distortion compensating unit according to a sixth embodiment.

FIG. 18 is a diagram illustrating a configuration example of a distortion compensating unit according to the sixth embodiment. In FIG. 18, the distortion compensating unit 110 includes an LUT 510 and a coefficient calculating unit 520. The LUT 510 includes an adjusting unit 511.

The adjusting unit 511 performs the same processing as the adjusting unit 222 according to any of the first to third embodiments, and outputs a distortion compensation coefficient to the multiplying unit 212.

Furthermore, when an address generated by the address generating circuit 216 is higher than the set clip threshold, the adjusting unit 511 outputs both of a distortion compensation coefficient retrieved with the set clip threshold and a distortion compensation coefficient retrieved with the address generated by the address generating circuit 216 as coefficient parameters to the coefficient calculating unit 520.

On the other hand, when an address generated by the address generating circuit 216 is equal to or lower than the set clip threshold, the adjusting unit 511 outputs a distortion compensation coefficient retrieved with the address generated by the address generating circuit 216 as a coefficient parameter to the coefficient calculating unit 520.

The coefficient calculating unit 520 generates a distortion compensation coefficient, i.e., a first LUT update value on the basis of the distortion compensation coefficient retrieved with the set clip threshold and a current transmission signal x(t). Furthermore, the coefficient calculating unit 520 generates a distortion compensation coefficient, i.e., a second LUT update value on the basis of the distortion compensation coefficient retrieved with the address generated by the address generating circuit 216 and the current transmission signal x(t).

Here, while the first and second LUT update values are being calculated, respective errors e(t) are calculated.

The coefficient calculating unit 520 selects either one of the first and second LUT update values whichever corresponds to a smaller error, and outputs the selected LUT update value to the writing unit 226.

Incidentally, when an address generated by the address generating circuit 216 is equal to or lower than the set clip threshold, the coefficient calculating unit 520 receives only a distortion compensation coefficient retrieved with the address generated by the address generating circuit 216. Therefore, in this case, the coefficient calculating unit 520 outputs an LUT update value generated on the basis of the distortion compensation coefficient retrieved with the address generated by the address generating circuit 216 and a current transmission signal x(t) to the writing unit 226.

Figure 19:
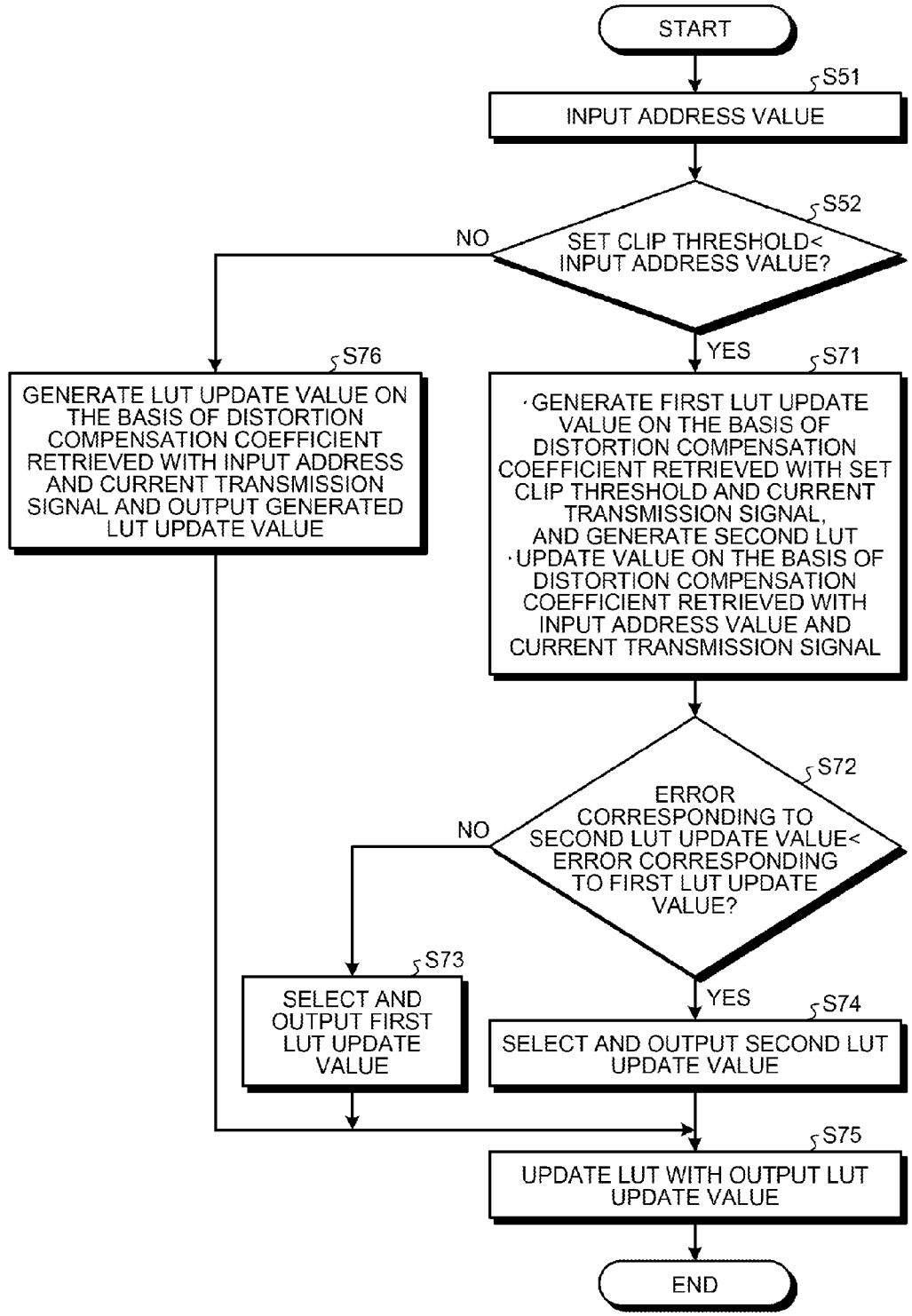
FIG. 19 is a flowchart illustrating an example of processing operation of the distortion compensating unit according to the sixth embodiment.

FIG. 19 is a flowchart illustrating an example of processing operation of the distortion compensating unit 110 according to the sixth embodiment.

The adjusting unit 511 performs the same process as described in FIG. 15 (Steps S51 and S52).

When the input address value is higher than the set clip threshold (YES at Step S52), the adjusting unit 511 outputs both of a distortion compensation coefficient retrieved with the set clip threshold and a distortion compensation coefficient retrieved with the address generated by the address generating circuit to the coefficient calculating unit 520. The coefficient calculating unit 520 generates a distortion compensation coefficient, i.e., a first LUT update value on the basis of the distortion compensation coefficient retrieved with the set clip threshold and a current transmission signal x(t) (Step S71). Furthermore, the coefficient calculating unit 520 generates a distortion compensation coefficient, i.e., a second LUT update value on the basis of the distortion compensation coefficient retrieved with the address generated by the address generating circuit 216 and the current transmission signal x(t) (Step S71).

The coefficient calculating unit 520 compares an error e(t) corresponding to the first LUT update value with an error e(t) corresponding to the second LUT update value (Step S72).

When the error e(t) corresponding to the first LUT update value is smaller than the error e(t) corresponding to the second LUT update value (NO at Step S72), the coefficient calculating unit 520 selects and outputs the first LUT update value to the writing unit 226 (Step S73).

When the error e(t) corresponding to the second LUT update value is smaller than the error e(t) corresponding to the first LUT update value (YES at Step S72), the coefficient calculating unit 520 selects and outputs the second LUT update value to the writing unit 226 (Step S74). Incidentally, Step S76 is the same process at Step S55 described in FIG. 15.

The writing unit 226 updates the LUT with the LUT update value output at any of Steps S73, S74, and S76 (Step S75).

As described above, according to the present embodiment, in the distortion compensating unit 110, the coefficient calculating unit 520 calculates an update value of the distortion compensation coefficient stored in the LUT on the basis of a transmission signal before amplification by the distortion-function calculating unit 214 (the amplifier), a transmission signal after the amplification, and a coefficient parameter. When an address generated by the address generating circuit 216 is higher than the set clip threshold, the coefficient parameter is both of a distortion compensation coefficient retrieved with the set clip threshold and a distortion compensation coefficient retrieved with the address generated by the address generating circuit. Then, the coefficient calculating unit 520 outputs an update value calculated on the basis of either one of the distortion compensation coefficient corresponding to the set threshold and the distortion compensation coefficient corresponding to the address value generated by the address generating circuit 216 whichever makes an error between the transmission signals before and after the amplification smaller than the other to the LUT 510.

By doing this, an update value can be calculated by using the coefficient parameter which is further closer to an ideal value and can reduce the error, and the LUT can be updated with the update value, and therefore, a time for the update value to approach the ideal value can be shortened.

[g] Other Embodiments

The wireless communication device (the base station) according to any of the first to sixth embodiments can be realized by the following hardware configuration.

Figure 20:
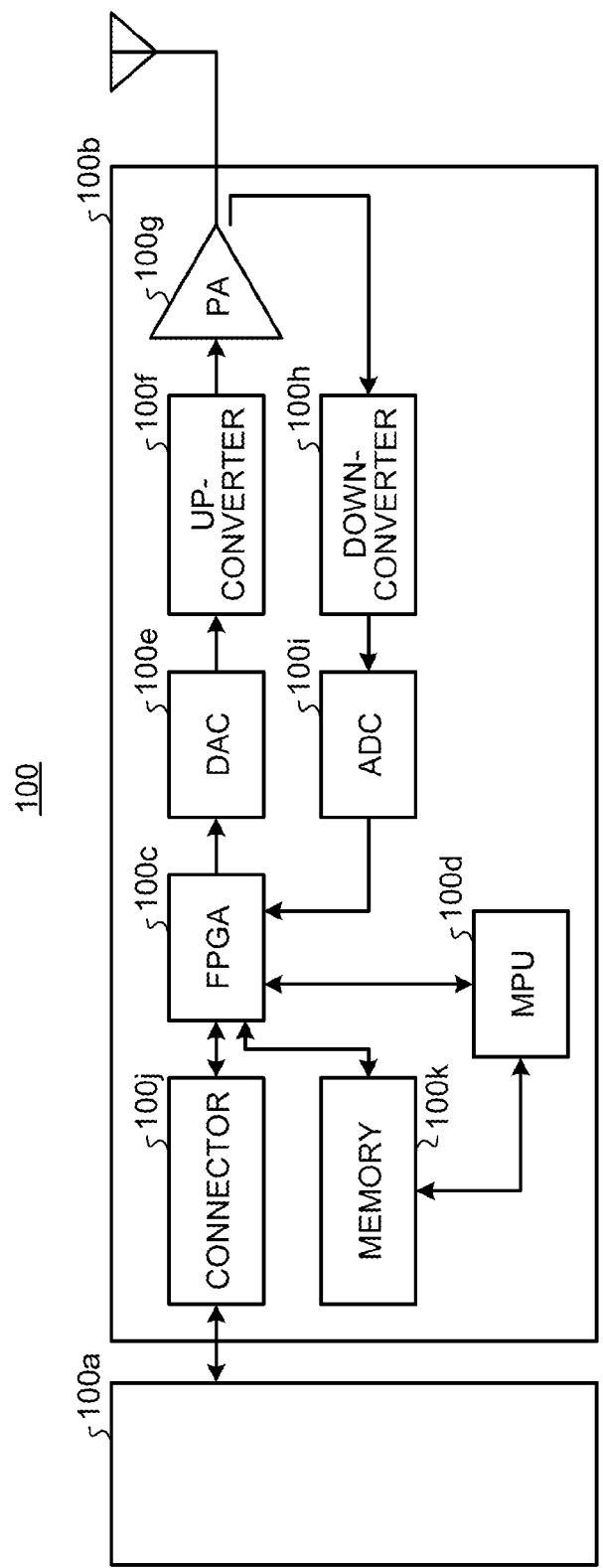
FIG. 20 is a diagram illustrating an example of a hardware configuration of the wireless communication device (a base station).

FIG. 20 is a diagram illustrating an example of a hardware configuration of the wireless communication device (the base station). As illustrated in FIG. 20, the wireless communication device 100 includes radio equipment control (REC) 100a and radio equipment (RE) 100b. The RE 100b includes a field programmable gate array (FPGA) 100c, a micro-processing unit (MPU) 100d, a DAC 100e, an up-converter 100f, a power amplifier (PA) 100h, a down-converter 100g, an ADC 100i, a connector 100j, and a memory 100k. The FPGA 100c and the MPU 100d are connected so as to input/output various signals and data. The memory 100k is made up of, for example, a RAM, such as a synchronous dynamic random access memory (SDRAM), a read-only memory (ROM), and a flash memory. The distortion compensating unit 110 is realized by an integrated circuit, such as the FPGA 100c and the MPU 100d.

Furthermore, various processes described in the first to sixth embodiments can be realized by causing a computer to execute prepared programs. Namely, respective programs corresponding to the processes performed by the distortion compensating unit 110 have been stored in the memory 100k and the FPGA 100c. The programs stored in the memory 100k can be read out by the MPU 100d and serve as processes.

According to an aspect of the present invention, it is possible to reduce the production of a spurious.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensating device for compensating distortion of an amplifier, the distortion compensating device comprising:
   a multiplying unit that multiplies an input transmission signal by an input distortion compensation coefficient;
   a generating unit that generates an address value corresponding to power of the transmission signal;
   an adjusting unit that, when the generated address value is higher than a set threshold, retrieves a distortion compensation coefficient corresponding to the set threshold from a storage unit and inputs the retrieved distortion compensation coefficient to the multiplying unit, and, when the generated address value is equal to or lower than the set threshold, retrieves a distortion compensation coefficient corresponding to the generated address value from the storage unit and inputs the retrieved distortion compensation coefficient to the multiplying unit; and
   a threshold calculating unit that calculates a threshold based on the generated address value and updates the set threshold with the calculated threshold.

2. The distortion compensating device according to claim 1, wherein the threshold calculating unit calculates the threshold by identifying a maximum value of address values generated in each adjustment unit period and subtracting a certain value from the identified maximum value.

3. The distortion compensating device according to claim 1, wherein
   the threshold calculating unit subtracts a certain value from the set threshold in a certain cycle.

4. The distortion compensating device according to claim 1, wherein
   when the set threshold has not been newly updated within an execution determining period which is a certain period of time starting from update timing of the set threshold, the threshold calculating unit subtracts a certain value from the set threshold.

5. The distortion compensating device according to claim 1, further comprising a coefficient calculating unit that calculates an update value of a distortion compensation coefficient stored in the storage unit based on the transmission signal before amplification by the amplifier, the transmission signal after the amplification, and a coefficient parameter, wherein
   when the generated address value is higher than the set threshold, and a distortion compensation coefficient which corresponds to the generated address value and has been stored in the storage unit is an initial value, the coefficient parameter is the distortion compensation coefficient corresponding to the set threshold.

6. The distortion compensating device according to claim 1, further comprising a coefficient calculating unit that calculates an update value of a distortion compensation coefficient stored in the storage unit based on the transmission signal before amplification by the amplifier, the transmission signal after the amplification, and a coefficient parameter, wherein
   when the generated address value is higher than the set threshold, the coefficient parameter is a weighted average value of the distortion compensation coefficient corresponding to the set threshold and the distortion compensation coefficient corresponding to the generated address value.

7. The distortion compensating device according to claim 1, further comprising a coefficient calculating unit that calculates an update value of a distortion compensation coefficient stored in the storage unit based on the transmission signal before amplification by the amplifier, the transmission signal after the amplification, and a coefficient parameter, wherein when the generated address value is higher than the set threshold, the coefficient parameter is both of the distortion compensation coefficient corresponding to the set threshold and the distortion compensation coefficient corresponding to the generated address value, and the coefficient calculating unit outputs, to the storage unit, the update value calculated based on one out of the distortion compensation coefficient corresponding to the set threshold and the distortion compensation coefficient corresponding to the generated address value, the one making an error between the transmission signals before and after the amplification smaller than the one that does not make the error between the transmission signals before and after the amplification smaller.

8. A distortion compensating method comprising:

generating, by a processor, an address value corresponding to power of a transmission signal;

when the generated address value is higher than a set threshold, retrieving a distortion compensation coefficient corresponding to the set threshold from a storage unit, and, when the generated address value is equal to or lower than the set threshold, retrieving, by the processor, a distortion compensation coefficient corresponding to the generated address value from the storage unit;

multiplying, by the processor, the transmission signal by the retrieved distortion compensation coefficient; and calculating, by the processor, a threshold based on the generated address value and updating the set threshold with the calculated threshold.

9. A distortion compensating device for compensating distortion of an amplifier, the distortion compensating device comprising:

a memory embedded with processes; and a processor connected to the memory, wherein the processor executes the processes of:

generating an address value corresponding to power of a transmission signal;

when the generated address value is higher than a set threshold, retrieving a distortion compensation coefficient corresponding to the set threshold from a storage unit, and, when the generated address value is equal to or lower than the set threshold, retrieving a distortion compensation coefficient corresponding to the generated address value from the storage unit;

multiplying the transmission signal by the retrieved distortion compensation coefficient; and calculating a threshold based on the generated address value and updating the set threshold with the calculated threshold.

\* \* \* \* \*